US008300197B2

(12) United States Patent
Inoue

(10) Patent No.: US 8,300,197 B2
(45) Date of Patent: Oct. 30, 2012

(54) LIQUID CRYSTAL DISPLAY DEVICE

(75) Inventor: Taishi Inoue, Saitama-ken (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 767 days.

(21) Appl. No.: 12/367,205

(22) Filed: Feb. 6, 2009

(65) Prior Publication Data
US 2009/0284681 A1 Nov. 19, 2009

(30) Foreign Application Priority Data

May 16, 2008 (JP) ................ P2008-129790

(51) Int. Cl.
*G02F 1/1345* (2006.01)
*G02F 1/1333* (2006.01)
*G02F 1/1335* (2006.01)

(52) U.S. Cl. ............... 349/150; 349/58; 349/61
(58) Field of Classification Search .......... 349/58–65, 349/149–152
See application file for complete search history.

(56) References Cited

U.S. PATENT DOCUMENTS
2008/0084520 A1* 4/2008 Nam et al. ............ 349/65

FOREIGN PATENT DOCUMENTS
JP 2006-163100 6/2006
* cited by examiner

*Primary Examiner* — Dung T. Nguyne
(74) *Attorney, Agent, or Firm* — Finnegan, Henderson, Farabow, Garrett & Dunner, L.L.P.

(57) ABSTRACT

A liquid crystal display device includes a liquid crystal display panel having a liquid crystal layer between a pair of substrates, a light unit arranged in overlapping with the liquid crystal display panel for illuminating the liquid crystal display panel, the light unit including a front case and a back case for housing a light member, and a flexible printed circuit board. The flexible printed circuit board has a folding back portion which is housed at the housing portion provided at the bottom of the case of the backlight unit to adjust its length. The printed circuit board is drawn out from the housing portion to outside and connected to the outer circuits. Accordingly, it is possible to provide a compact and slim type liquid crystal display device.

11 Claims, 4 Drawing Sheets

LIQUID CRYSTAL DISPLAY DEVICE

CROSS-REFERENCE TO RELATED APPLICATIONS

This application is based upon and claims the benefit of priority from prior Japanese Patent Application No. 2008-129790, filed May 16, 2008, the entire contents of which are incorporated herein by reference.

BACKGROUND OF THE INVENTION

1. Field of the Invention

The present invention relates generally to a liquid crystal display device, and more particularly, to an arrangement for connecting a flexible printed circuit board to a liquid crystal display device.

2. Description of the Related Art

A liquid crystal display device, which is a typical example of a flat-screen display device, includes a liquid crystal display panel having a liquid crystal layer held between an array substrate and a counter substrate using a seal member. The liquid crystal display panel includes an active area which is composed of matrix-arrayed pixels. The liquid crystal display devices are widely used as display devices for various kinds of equipment such as personal computers, OA equipments, and TV sets because the display devices have many advantages such as lightness, compactness and low power consumption. In recent years, the liquid crystal display device is also used in a mobile terminal equipments such as a mobile phone, a car navigation device and a game player.

Japanese laid open patent application 2006-163100 discloses one example of a liquid crystal display device having a liquid crystal display panel, a flexible printed circuit board and a back light unit housed in a case. Specifically, a flexible printed circuit board is drawn out of slits formed on the rear surface of the bottom of the case and fixed on the rear surface by folding at least twice to form double layers. The folded flexible printed circuit board is fixed by engaging some protrusions formed on the rear surface of the bottom of the housing case with apertures formed on the surface of the flexible printed circuit board. Furthermore, the flexible printed circuit board is adhered by a double faced adhesive tape that is provided on the extended-out portion of the flexible printed circuit board.

As described-above, though the Japanese laid open patent application discloses a technique to implement a long flexible printed circuit board compactly, the total thickness of the module increases due to the expansion of the folded portion of the flexible printed circuit. The length of the flexible printed circuit board varies according to the specification of the equipment provided with outer circuits to which the flexible printed circuit board is connected. Accordingly, in case that further compactness of the module, that is, a shorter flexible printed circuit board to be drawn out is required. It may be thought to fold more times the flexible printed circuit board, however, which results in more increase of the total thickness of the module.

BRIEF SUMMARY OF THE INVENTION

The present invention has been made to address to the above-mentioned problems.

According to one first aspect of the invention, there is provided a liquid crystal display device including a liquid crystal display panel having a liquid crystal layer between a pair of substrates; a light unit arranged in overlapping with the liquid crystal display panel, the light unit for illuminating the liquid crystal display panel, the light unit including a front case and a back case for housing a light member; a shield case for fixing the liquid crystal display panel with the light unit; and a flexible printed circuit board connected to the liquid crystal display panel, the flexible printed circuit board having a folding back portion being fixed to a rear surface of the bottom of the back case of the light unit, wherein the light unit includes a housing portion provided at the bottom of the back case for housing the folding back portion of the flexible printed circuit board.

According to another aspect of the invention, there is provided a liquid crystal display device including a liquid crystal display panel having a liquid crystal layer between a pair of substrates; a light unit arranged in overlapping with the liquid crystal display panel, the light unit for illuminating the liquid crystal display panel, the light unit including a front case and a back case for housing a light member; a shield case for fixing the liquid crystal display panel with the light unit; and a flexible printed circuit board connected to the liquid crystal display panel, the flexible printed circuit board having a folding back portion being fixed to a rear surface of the bottom of the back case of the light unit, wherein the light unit includes a longitudinal concaved housing portion provided at the bottom of the back case for housing the folding back portion of the flexible printed circuit board, and an end portion of the printed circuit board is led out to outside of the devise.

According to other aspect of the invention, there is provided a liquid crystal display device including: a liquid crystal display panel having a liquid crystal layer between a pair of substrates; a light unit arranged in overlapping with the liquid crystal display panel, the light unit for illuminating the liquid crystal display panel, the light unit including a front case and a back case for housing a light member; and a flexible printed circuit board connected to the liquid crystal display panel, the flexible printed circuit board having a folding back portion being fixed to a rear surface of the bottom of the back case of the light unit, wherein the light unit includes a housing portion provided at the bottom of the back case for housing the folding back portion of the flexible printed circuit board and the housing portion is formed by a longitudinal aperture having a longitudinal axis thereof approximately parallel with a width direction of the folding back portion, and wherein the flexible printed circuit board has a T-shape having a first end portion connected to the liquid crystal display panel and a second end portion with a narrower width than the first end portion and connected to outer circuits, and the folding back portion is formed at the second end portion side.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWING

The accompanying drawings, which are incorporated in and constitute a part of the specification, illustrate presently exemplary embodiments of the invention, and together with the general description given above and the detailed description of the preferred embodiments given below, serve to explain the principles of the invention.

DETAILED DESCRIPTION OF THE INVENTION

A display device according to an exemplary embodiment of the present invention, in particular, a liquid crystal display device, will now be described with reference to the accompanying drawings.

Figure 1:
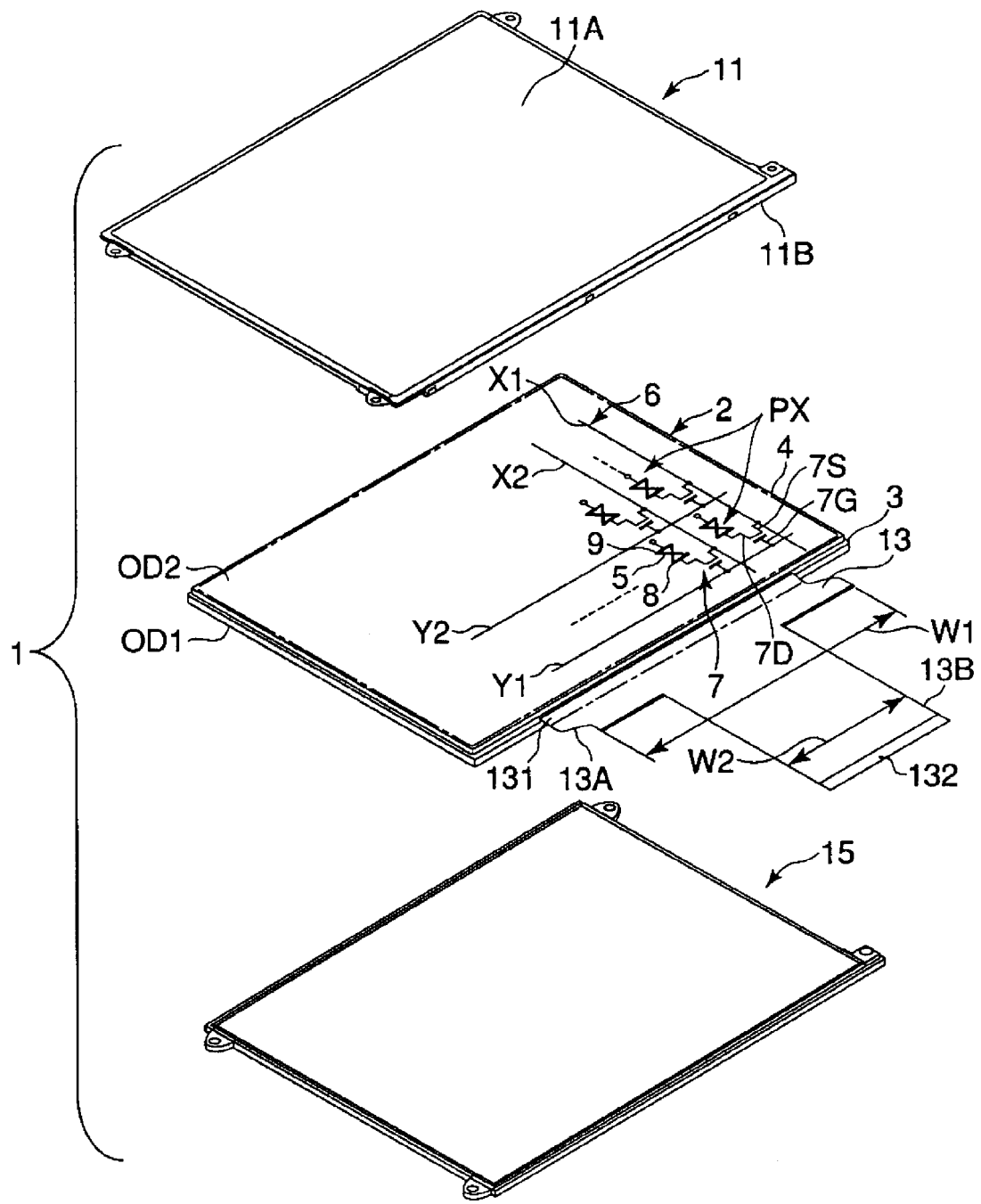
FIG. 1 is an exploded perspective diagram showing a structure of a liquid crystal display device according to an embodiment of the present invention.

As shown in FIG. 1, a liquid crystal display device includes an approximately rectangular-shaped flat liquid crystal display panel 2 and a backlight unit 15 to illuminate the display panel 2. The liquid crystal display panel 2 has a pair of electrode substrates, which are an array substrate 3 and a counter substrate 4, sandwiching a liquid crystal layer 5 which functions as a light modulation layer. The liquid crystal display panel 2 includes an approximately rectangular active area 6 to display pictures. The active area 6 consists of a plurality of pixels PX arranged in matrix state. The array substrate 3 includes, in the active area, a plurality of scanning lines Y (1, 2, 3, . . . , m) which extend in a row direction of the pixels PX, a plurality of signal lines X (1, 2, 3, . . . , n) which extend in a column direction of the pixels PX crossing the scanning lines Y such as to interpose a dielectric layer therebetween and switching elements 7 which are disposed near the intersections of the scanning lines Y and the signal lines X. Pixel electrodes 8 are connected to the associated switching elements 7. The switching elements 7 are formed by Thin Film Transistors (TFTs) which include a semiconductor layer made of amorphous or polysilicon. A gate electrode 7G of the switching elements 7 is electrically connected to the corresponding scanning lines Y. A source electrode 7S of the switching elements 7 is connected to the corresponding signal lines X. A drain electrode 7D of the switching elements 7 is connected to the pixel electrodes 8 of the pixels PX.

The counter substrate 4 includes a counter electrode 9 which is commonly disposed on the counter substrate 4 for all or some pixels PX. Some portions of the pixel electrodes 8 and the counter electrode 9 of the counter-substrate 4 are formed of conductive material with light transmissive characteristics such as Indium Ting Oxide (ITO) and Indium Zing Oxide (IZO). The array substrate 3 and counter-substrate 4 are attached to each other by a seal member such that a predetermined gap for holding the liquid crystal layer 5 is created therebetween. The liquid crystal display panel 2 includes a approximately rectangular active area 6, which displays pictures within the region surrounded by the seal member. The active area 6 includes a plurality of pixels PX which are arrayed in a matrix state and a plurality of signal supply wiring lines which supply various signals that are necessary for driving the respective pixels PX. The array substrate 3 is formed by using a light transmissive insulating substrate such as a glass substrate.

The array substrate 3 and the counter-substrate 4 are attached to each other by a seal member in the state in which a predetermined gap by using a spacer like a columnar spacer, not shown, is created between the array substrate 3 and the counter-substrate 4. Liquid crystal material is injected into the gap. The surfaces of the array substrate 3 and the counter substrate 4 contacting the liquid crystal material are covered by an alignment layer, respectively.

Light elements OD1 and OD2 are formed on the outer surfaces of the array substrate 3 and the counter-substrate 4, respectively. Light elements OD1 and OD2 include polarizers which set the direction of the polarized light fitting to the characteristics of the liquid crystal layer. In the color type liquid crystal display, a color filter layer is formed of resin materials which are colored in a plurality of colors, for example, in the three primary colors of red (R), green (G) and blue (B). The red color resin, green color resin and blue color resin are disposed in association with a red pixel, a green pixel and a blue pixel, respectively. The color filter layer may be disposed on the array substrate 3 or the counter-substrate 4. The liquid crystal display device includes a shield case 11 of a rectangular frame shape. The shield case 11 consists of a rectangular window portion 11A which exposes the active area 6 of the liquid crystal display panel 2 and a frame portion 11B which defines the window portion 11A. The liquid crystal display panel 2, as mentioned above, is held between the backlight unit 15 and the shield case 11.

This means that the shield case 11 holds integrally the backlight unit 15 with the liquid crystal display panel 2. The backlight unit 15 is arranged such as to face to the surface of the rear side, that is, the array substrate side of the liquid crystal display panel 2 to illuminate.

Further, the liquid crystal display device includes a flexible printed circuit board 13 electrically connected to the liquid crystal display panel 2. The flexible printed circuit board 13 is also connected to signal sources of outer circuits of the equipment so as to supply such various drive signals as a power source and picture signals required for driving pixels PX, which are outputted from the signal sources. The flexible printed circuit board 13 includes a first end portion 131 connected to the liquid crystal display panel 2 and a second end portion 132 connected to the outer circuits, respectively. The first end portion 131 is connected to pads positioned at one edge of the array substrate 3, more specifically, the extended portion of the array substrate 3 beyond the overlapped portion of the counter substrate 4 via an anisotropic conductive film.

In the flexible printed circuit board 13, the width W2 of the second end portion 132 is smaller than that W1 of the first end portion 131. According to the exemplary embodiment shown in FIG. 1, the flexible printed circuit board 13 has approximately T shaped body of thin film consisting of a head portion 13A and a leg portion 13B of approximately rectangular shape which tapers from the first end portion 131 toward the second end portion 132.

Figure 2:
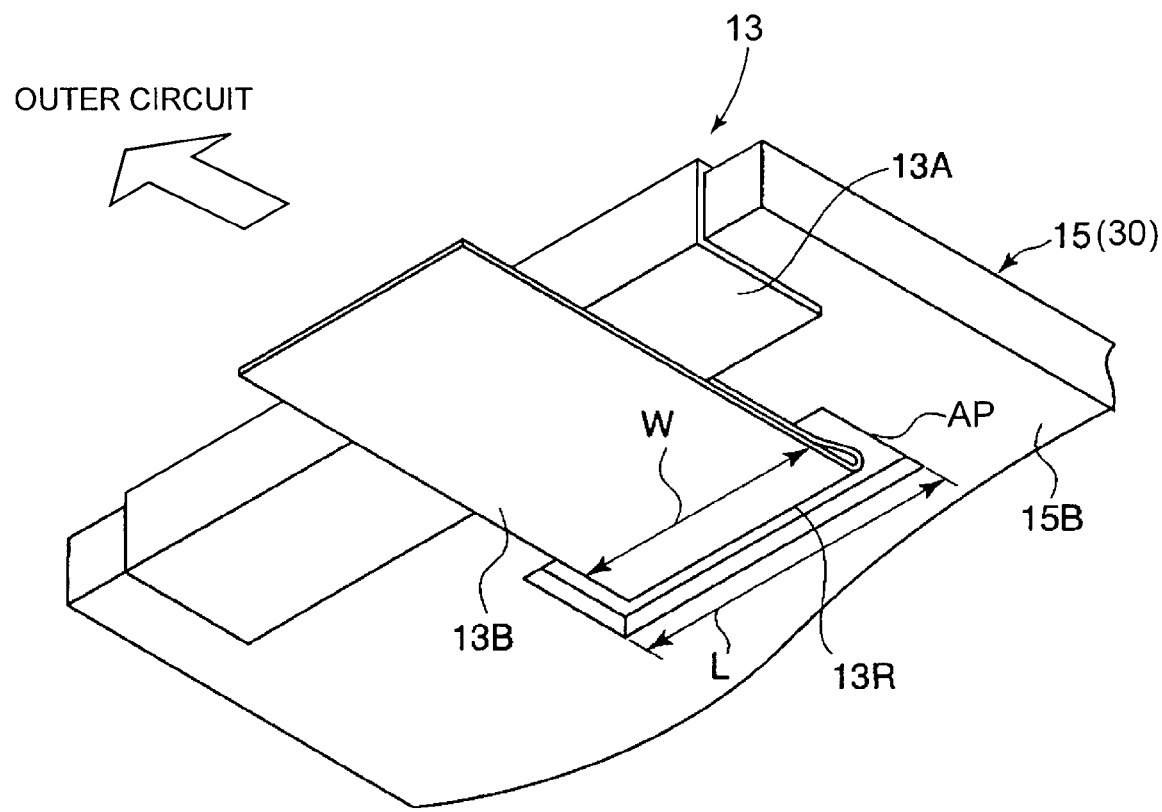
FIG. 2 is a perspective diagram showing a rear structure of a backlight unit applicable to a liquid crystal display device shown in FIG. 1.

When the liquid crystal display panel 2 and the backlight unit 15 are integrally housed by the shield case 11 to make a module as shown in FIG. 1 and FIG. 2, the printed circuit board 13 is led out to a certain area of the rear surface of the bottom of the backlight unit 15 passing through the space between the backlight unit 15 and the shield case 11. Further the flexible printed circuit board 13 is also folded at the certain area of the rear surface 15B of the bottom of the backlight unit 15 forming the folding back portion 13R and at least some portion of the leg portion 13B is led out from the module to outside. The folding back portion 13R is formed at the second end portion side, that is, the leg portion 13B. Thus, the printed circuit board 13 can be connected to outer circuits via the second end portion 132. On the other hand, an aperture AP is formed on the rear surface 15B of the bottom of the back light unit 15 corresponding to the folding back portion of the flexible circuit board 2 as a housing portion for housing the folding back portion 13R. The flexible printed circuit board 13 is folded twice on the aperture to form double layers.

Figure 3:
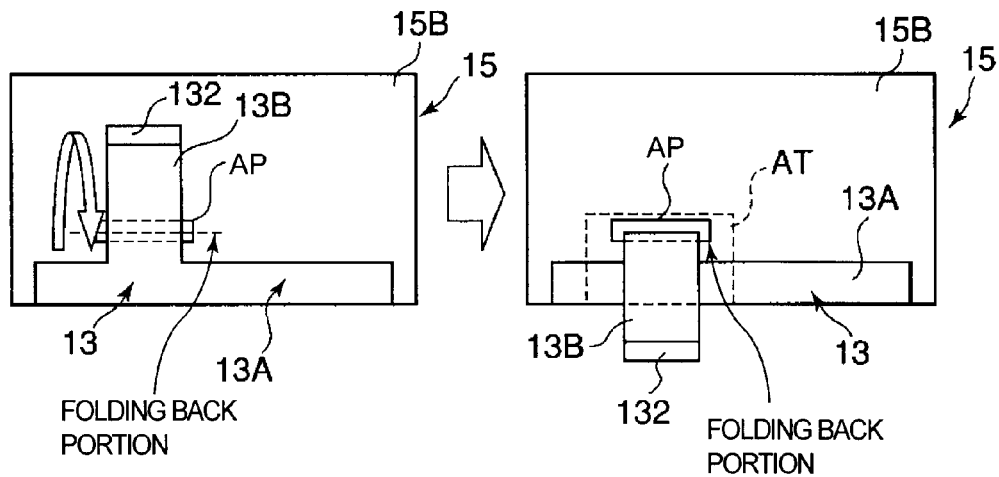
FIG. 3 is a plane view explaining the way to fold and fix the flexible printed circuit board at a certain area of the rear surface of the bottom of the backlight unit by an adhesive tape.

According to the above construction, even if the folding back portion 13R is expanded by spring stress, it is possible to house the folding back portion 13R in the aperture AP. Accordingly, the increase of the total thickness of the module resulted by the folding back portion 13R can be suppressed. Further, it is possible to fix the printed circuit board 2 with desired lead out length by adjusting the position of the aperture AP as needed. The folding back portion 13R is fixed by adhesive tape AT on the rear surface 15B of the bottom of the back light unit 15 as shown in FIG. 3. The adhesive tape AT is attached such as to cover the folding back portion 13R and fix the flexible circuit board 2 at the rear surface 15B. Since the folding back portion 13R is pushed to the aperture AP, even if the folding back portion 13R is expanded, the expansion is absorbed in the aperture AP of the back light unit 15. Therefore, the increase of the total thickness of the module is suppressed.

In this embodiment, the aperture AP is formed in a longitudinal shape having a long axis to one direction. As shown in FIG. 2, the aperture AP is formed in a rectangular shape, however, an ellipse shape like a field track shape can be applicable. It is not desirable to form an unnecessarily large aperture which results in the weakness of the mechanical strength of the back light unit 15.

Accordingly, the long side of the aperture AP is formed such as to arrange approximately parallel with the narrow side of the foot portion 13B of the printed circuit board 13 and absorb the expansion of the folding back portion 13R, which prevents the mechanical expansion of the back light unit 15 from being weak remarkably.

It is preferable to form the folding back portion 13R in the foot portion 13B positioned in the second end side 132 with a narrower width than that of the head portion 13A. On the other hand, the aperture AP is so arranged that the length L of the long side of the aperture AP is approximately equal to or slightly larger than the width W of the folding back portion 13R. Above configuration has an advantage to shorten the length of the longer side of the aperture compare with such configuration that the folding back portion 13R is formed at the head portion 13A, which suppress the remarkable weakness of the mechanical strength of the back light unit 15.

More detailed construction of the back light unit 15 according to one embodiment will be described below.

Figure 4:
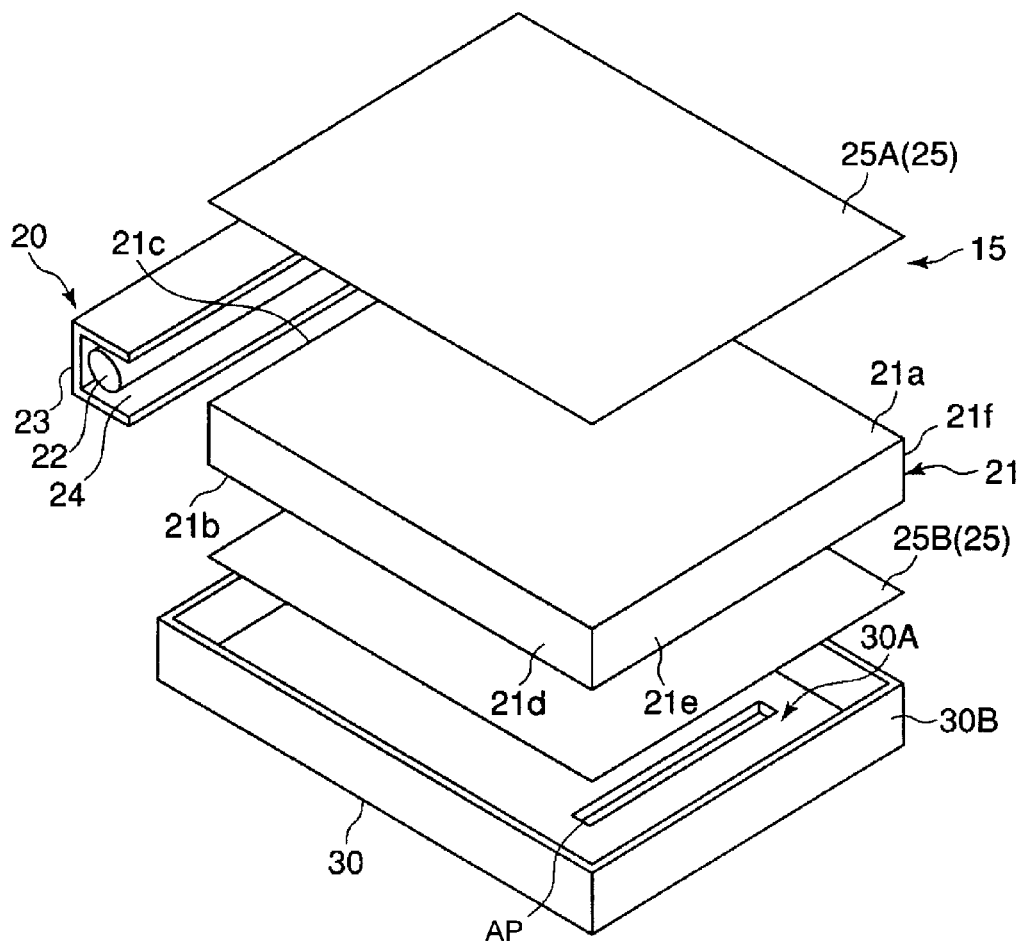
FIG. 4 is an exploded perspective diagram showing the structure of the backlight unit.

The back light unit 15 includes an optical member 20 and a light guiding plate 21 as shown in FIG. 4. The optical member 20 consists of a a cold cathode fluorescent lamp (CFL) 22 as a light source and a reflector 23 which surrounds the CFL and reflects the emitted light from the CFL to the light guiding plate 21. The reflector 23 is approximately U shape in cross section and includes an opening 24 to lead out the emitted light from the CFL to the guiding plate 21. Light emitting diodes (LEDs) can be used as a light source 22. The light guiding plate 21 for guiding the emitted light to the liquid crystal panel 2 is made up with such light transmissive resign as acrylic and polycarbonate resin. There are two types of the light guiding plate 21, an wedge shape type and a flat type having approximately equal thickness. In this embodiment, the flat type light guiding plate 21 is used. The light guiding plate 21 consists of a first main surface 21a facing to the liquid crystal panel 2, a second main surface 21b facing to first main surface 21a and four edge surfaces 21c, 21d, 21e, 21f connecting the main surfaces 21a to the second main surface 21b. All the surfaces are formed in approximately rectangular shape. While the edge surface 21c facing the light source 22 works as an incident surface from the light source 20, first main surface 21a works as an output surface for emitting the light to the liquid crystal panel 2.

The back light unit 15 has a plurality of optical sheets for giving some predetermined light characteristics to the emitted light from the light guiding plate 21. The back light unit 15 comprises an optical sheet 25A disposed on the first main surface 21a of the light guiding plate 21 and an optical sheet 25B disposed on the second main surface 21b, respectively.

In the embodiment shown in FIG. 4, only one optical sheet 25A is used, however, more than two sheets may be stacked on the main surfaces. Generally, two to four sheets are stacked on the surface of the guiding plate 21. As the light sheet 25A, such light sheets having various functions as a diffusion sheet, a lens sheet and sheets having multiple functions are applicable. A reflective sheet is applicable as the optical sheet 25B.

Figure 5:
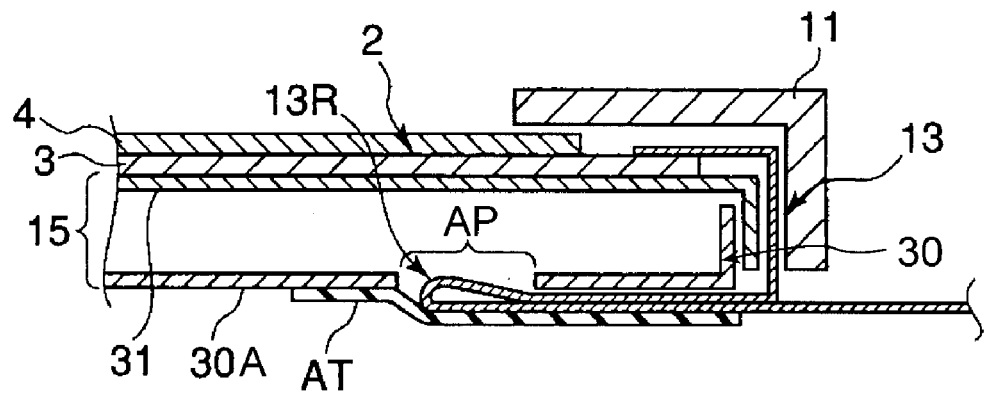
FIG. 5 is a partly diagrammatic sectional view showing the liquid crystal display device in which the backlight unit shown in FIG. 4 is applied according to the embodiment of the invention.

While the diffusion sheet diffuses the transmitted light, the lens sheet focuses the transmitted light to viewers. The reflective sheet reflects back the leaked light from the light guiding plate thereto. These optical sheets are formed in rectangular shape having approximately same size as the first and second main surfaces 21a and 21b of the light guiding plate 2. Moreover, the back light unit 15 includes a back case 30 such as to house the light element 20 and the light guiding plate 21. The back case 30 is formed in a boxed-shape having a bottom 30A and side wall 30B built on the bottom 30A. The light guiding plate 21 is formed on the light sheet 25B and the light sheet 25A is formed on the light guiding plate 21, respectively. In the back case 30 of the back light unit 15, the aperture AP is formed at a certain area of the bottom 30A. When the module is made as shown in FIG. 4 and FIG. 5, the folding back portion 13R of the printed circuit board 2 is housed in the back light unit 15 via aperture AP from the back side of the bottom 30A. The back light unit 15 comprises a front case 31 for housing the light element 20, light guiding plate 21 and various light sheets 25 with the back case 30 integrally, as shown in FIG. 5. The front case 31 has an window for exposing the light sheet 25A.

According to this embodiment, the backlight unit 15 includes the aperture AP overlapping with the folding back portion 13R of the printed circuit board 13, thereby, it is possible to house the folding back portion 13R in the backlight unit 15 and suppress the remarkable increase of the total thickness of the module. Therefore, it becomes possible to meet the requirement of the slim and compact configuration of the module.

Figure 6:
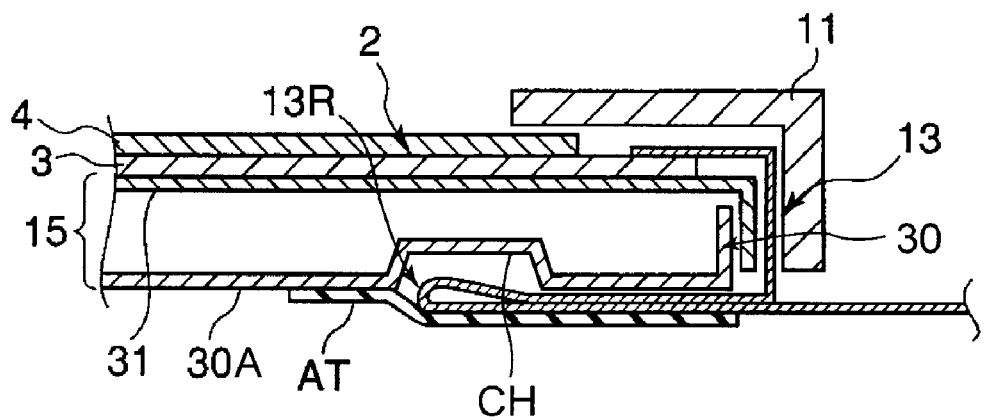
FIG. 6 is a partly diagrammatic sectional view showing the liquid crystal display device in which a longitudinal concaved housing portion is formed in a certain area of the rear surface of the bottom of the back light unit for housing the folding back portion of the printed circuit board.

According to another embodiment, a longitudinal concaved housing portion CH shown in FIG. 6 may be formed at the bottom 30A of the back case 30 of the light unit 15 corresponding to the folding back portion 13R of the printed circuit board 2 to be housed in case that the aperture AP is not applicable to prevent from some dust penetrating into the back light unit 15. The concaved housing portion CH is formed by pressing the bottom 30A of the back case 30.

As described above, the connection between the liquid crystal panel 2 and outer circuits of the equipment which output various driving signals to drive the liquid crystal display device is made via the flexible print circuit board 13. The length of the flexible printed circuit board 13 which is led out from the module or the position of the second end portion 132 is determined by the specification of the equipment provided with outer circuits connected to the flexible printed circuit board 13. In some specification, the flexible printed circuit board 13 is folded along with the rear surface of the bottom 30A of the backlight unit 15 and further required to be led out from the module by folding the printed circuit board twice to form double layers. Even if the folding back portion 13R expands by the spring stress, the increase of the total thickness of the module is suppressed by housing the folding portion 13R in the concaved housing portion CH.

The present invention is not limited directly to the above-described embodiments. In practice, the structural elements can be modified without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined.

In the above embodiments, one modulation method, in which a vertical electrical field between the array substrate and the common substrate is used to drive liquid crystal molecules in the liquid crystal layer, is used. Of course, such other mode as in plane swiching method, in which picture electrodes and common electrodes are formed in one substrate and uses lateral electrical fields between both electrodes parallel with the substrate may be used to modulate the liquid crystal layer.

In the above embodiments, various kinds of transmissive type liquid crystal display panels, in which the light from the backlight unit 15 is selectively transmitted to some portions of the active area 6, is used. A transreflective type liquid crystal display panel in which each pixel electrode consists of a reflective portion and a transmissive portion can be also used.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A liquid crystal display device comprising:
   a liquid crystal display panel having a liquid crystal layer between a pair of substrates;
   a light unit arranged in overlapping with the liquid crystal display panel, the light unit for illuminating the liquid crystal display panel, the light unit including a front case, a light member, and a back case for housing the light member;
   a shield case for fixing the liquid crystal display panel with the light unit; and
   a flexible printed circuit board connected to the liquid crystal display panel, the flexible printed circuit board having a folding back portion being fixed to a rear surface of the bottom of the back case of the light unit,
   wherein the light unit includes:
      a housing portion provided at the bottom of the back case for housing the folding back portion of the flexible printed circuit board, and
      an adhesive tape covering and fixing the folding back portion in the housing portion.

2. The liquid crystal display device according to claim 1, wherein the housing portion is formed by a longitudinal aperture having a longitudinal axis thereof approximately parallel with a width direction of the folding back portion.

3. The liquid crystal display device according to claim 2, wherein the aperture has elliptical shape.

4. The liquid crystal display device according to claim 1,
   wherein the flexible printed circuit board has a T-shape having a first end portion connected to the liquid crystal display panel and a second end portion with narrower width than the first end portion and connected to outer circuits; and
   wherein the folding back portion is formed at the second end portion side, and the longitudinal length of the aperture is arranged to be approximately equal to or larger than a width of the folding back potion.

5. The liquid crystal display device according to claim 1, wherein the light member comprises a light source, and a light guide plate for guiding the emitted light from the light source to the liquid crystal display panel.

6. The liquid crystal display device according to claim 1, wherein the flexible printed circuit board is drawn out passing a gap disposed between the light unit and the shield case to the rear surface of the bottom of the back case of the light unit.

7. A liquid crystal display device comprising:
   a liquid crystal display panel having a liquid crystal layer between a pair of substrates;
   a light unit arranged in overlapping with the liquid crystal display panel, the light unit for illuminating the liquid crystal display panel, the light unit including a front case, a light member, and a back case for housing the light member;
   a shield case for fixing the liquid crystal display panel with the light unit; and
   a flexible printed circuit board connected to the liquid crystal display panel, the flexible printed circuit board having a folding back portion being fixed to a rear surface of the bottom of the back case of the light unit,
      wherein the light unit includes a longitudinal concaved housing portion provided at the bottom of the back case for housing the folding back portion of the flexible printed circuit board, and an adhesive tape covering and fixing the folding back portion in the housing portion; and
      an end portion of the printed circuit board is led out to outside of the device.

8. The liquid crystal display device according to claim 7, wherein the longitudinal concaved housing portion has an approximately rectangular in plane.

9. The liquid crystal display device according to claim 7, wherein the light unit comprises a light source and a light guide plate for guiding the emitted light from the light source to the liquid crystal display panel housed in the back case.

10. The liquid crystal display device according to claim 7,
    wherein the flexible printed circuit board has a T-shape having a first end portion connected to the liquid crystal display panel and a second end portion with a narrower width than the first end portion and connected to outer circuits; and
    wherein the folding back portion is formed at the second end portion side, and the longitudinal length of the concaved housing portion is arranged to be approximately equal to or larger than a width of the folding back potion.

11. A liquid crystal display device comprising:
    a liquid crystal display panel having a liquid crystal layer between a pair of substrates;
    a light unit arranged in overlapping with the liquid crystal display panel, the light unit for illuminating the liquid crystal display panel, the light unit including a front case, a light member, and a back case for housing the light member; and a flexible printed circuit board connected to the liquid crystal display panel, the flexible printed circuit board having a folding back portion being fixed to a rear surface of the bottom of the back case of the light unit, wherein:

the light unit includes a housing portion provided at the bottom of the back case for housing the folding back portion of the flexible printed circuit board, and an adhesive tape covering and fixing the folding back portion in the housing portion;

the housing portion is formed by a longitudinal aperture having a longitudinal axis thereof approximately parallel with a width direction of the folding back portion;

the flexible printed circuit board has a T-shape having a first end portion connected to the liquid crystal display panel and a second end portion with a narrower width than the first end portion and connected to outer circuits; and the folding back portion is formed at the second end portion side.

* * * * *